United States Patent [19]

Smith et al.

[11] Patent Number: 5,063,361
[45] Date of Patent: Nov. 5, 1991

[54] SERRODYNE MODULATOR

[75] Inventors: Irl W. Smith, Concord; Manfred J. Schindler, Newton, both of Mass.

[73] Assignee: Raytheon Company, Lexington, Mass.

[21] Appl. No.: 633,558

[22] Filed: Dec. 21, 1990

[51] Int. Cl.$^5$ .................................. H04L 27/00
[52] U.S. Cl. ...................................... 332/103; 332/104
[58] Field of Search .................. 332/103, 104, 144

[56] References Cited

U.S. PATENT DOCUMENTS 4,873,500 10/1989 Genrich ........................ 332/104

Primary Examiner—Robert J. Pascal
Attorney, Agent, or Firm—Denis G. Maloney; Richard M. Sharkansky

[57] ABSTRACT

A direct digital synthesizer (DDS) includes a phase accumulator which generates phase words periodically and means for changing the phase of an RF signal. In a preferred embodiment, a DDS includes a pair of phase shifter channels having inputs and outputs coupled in parallel by make before break RF switches. The use of the dual phase shifter channels and make before break RF switches provides relatively smooth phase advance while eliminating fly-back transitions. This arrangement reduces excessive noise power in the output signal.

6 Claims, 6 Drawing Sheets

SERRODYNE MODULATOR

BACKGROUND OF THE INVENTION

This invention relates generally to radio frequency circuits and more particularly to radio frequency modulators.

As is known in the art, many electronic warfare systems and communication systems rely upon the generation of rapidly changing frequencies over a wide band of frequencies from typically under 100 MHz to tens of GHz. At the present time, the requirements for circuits to generate the rapidly changing frequencies in communication systems are concerned principally with providing sources having relatively high spectral purity for the output signal. In the electronic warfare systems, the requirements are more often driven by the ability of the source to rapidly change frequency. This characteristic of a source to rapidly change frequency is commonly referred to as "agility" or specifically "frequency agility."

Several techniques are known in the art for achieving rapidly changing frequencies over a wide band of interest. The choice of a particular technique is generally determined at least in part by the band of interest over which the system must operate and the tuning range desired to interact with the operative bandwidth. Given specific requirements for bandwidth and tuning range, each of these requirements impact system complexity by the amount of filtering needed at the output of the signal source. Further, for some broadband applications, the bandwidth is divided into a number of sub-bands, which have associated circuits used to generate the frequencies within the desired subband of interest. Thus, for more demanding system requirements, bandwidth and tuning range may have a significant impact on system cost and complexity.

Three techniques are presently used for providing frequency agile signals for electronic warfare and communication systems. The techniques are digital voltage controlled oscillators (DVCO), direct access synthesizers (DAS), and direct digital synthesizers (DDS).

In a digital voltage controlled oscillator (DVCO), a well characterized voltage controlled oscillator having acceptable open loop stability is controlled by a highly precise voltage source which is set to a desired voltage via a lookup table or other technique. The desired voltage is selected to have a value which is expected to produce the desired output frequency from the oscillator. Typically, the DVCO frequency is calibrated during operation or in other words "on the fly" via techniques such as beat-note counting or simple frequency counting to provide an accurate frequency representation. Recalibration at various intervals from 0.1 seconds up to 10 seconds is often used to maintain the accuracy of the calibration. While the DVCO offers high purity and relatively broadband tuning ranges, the DVCO is nevertheless large, costly, and less reliable than other approaches.

The second technique, the direct-access synthesizer includes a plurality of frequency sources which are derived from a common stable frequency reference. Each source is maintained in a circuit which feeds a switching network. The maintained frequencies are chosen so that combinations of such frequencies can be used to obtain any desired output frequency by repeatedly mixing the frequency sources and filtering the resulting frequency to provide the output frequency. That is, when a new output frequency is commanded, switches in the switch network are set to select the proper combination of maintained frequencies to feed a mixer/filter matrix of circuits and thus provide the requisite output signal frequency. The settling time of such a circuit is determined principally by the settling time of the cascade of switches, filters, and mixers. One problem with this technique is the relative complexity involved in providing the mixer/filter matrix and the difficulty required in maintaining the multitude of frequency sources.

In the third technique, the so-called direct digital synthesizer, the phase $\phi(t)$ of the desired output signal is calculated in real time by a circuit referred to as a phase accumulator. The phase accumulator can be thought of as a digital integrator. The phase accumulator is fed by a stable frequency clock signal having a frequency $f_c$ and a control word representing $\Delta\phi$. The value of $\Delta\phi$ is chosen such that $f_c\Delta\phi$ is the desired output frequency. The phase accumulator includes a digital binary adder whose output is fed to a latch clocked at a frequency $f_c$. The latch output representing $\phi(t)$ is fed back to the input of the adder and $\Delta\phi$ is fed to the other input of the adder. The output of the phase accumulator is a binary representation of phase $\phi$ between 0 and $2\pi$ radians and the input of the phase accumulator is the binary representation of a phase increment $\Delta\phi$ such that $\phi(t)=tf_c\Delta\phi+$(a constant). If $2^N$ states of the binary phase accumulator corresponds exactly to $2\pi$ radians of phase shift, then overflows represent errors of an integer times $2\pi$ and hence do not affect the value of the output waveform since $2\pi$ is the period of the waveform. The output of the phase accumulator is applied to a digital to analog converter which accepts a binary word representing $\phi$ and generates analog voltages proportional to sine $\phi$ and cosine $\phi$. This type of a digital to analog converter commonly called a DASC or digital to analog sine/cosine converter has its outputs fed to a quadrature-balanced mixer, which is also fed by a local oscillator (LO) to produce a modulated local oscillator frequency to provide the desired RF output frequency.

There are several implementations of the digital-/analog sine converter. For example, one implementation simply may employ a read only memory (ROM) with each binary word of phase corresponding to an address in the ROM and each word of the ROM corresponding to the binary representation of the sine or cosine function of the address of that word. The output of the ROM, accordingly, is the digital representation of sine $\phi$ or cosine $\phi$ and when applied to a linear digital-to-analog converter results in an analog waveform. A ROM-DAC-based system would require the use of large ROMs to provide acceptable waveform accuracy and spectral purity. Moreover, throughput (i.e. tuning range) is more limited than with other approaches. Further, since a ROM is a large, complex digital part it would not be a good candidate for integration with microwave analog circuits on a common integrated semiconductor chip, particularly GaAs.

A second implementation of the sine converter, which is faster but less accurate than the ROM-DAC system described above is to use specially designed non-linear DACs which implement the digital to analog sine functions directly. The problem with this system is that a DASC of more than 7 or 8 bits of phase resolution is extremely large and thus a DASC is not preferred where high accuracy is required. Furthermore, even an 8-bit DASC is a circuit of VLSI complexity and is difficult to integrate with microwave circuitry on one chip.

Both of the above approaches (ROM-DAC and DASC) are only applicable to baseband frequencies less than $f_c$. The upconversion (mixing) needed to generate RF generates spurious frequencies which must be filtered out thus limiting the bandwidth and greatly increasing system complexity.

SUMMARY OF THE INVENTION

In accordance with the present invention, a direct digital synthesizer includes phase accumulator means fed by a control word for computing a desired phase word whose time rate of change is proportional to a desired output frequency of the direct digital synthesizer and means fed by said phase word for imparting a phase shift to a signal fed thereto. With such an arrangement, a direct digital synthesizer is provided. This approach will provide acceptable waveform accuracy and spectral purity. Further, since the phase accumulator is a relatively simple circuit compared to more complex read only memories and digital to analog sine converters, such an approach would be more easily implemented as a digital monolithic microwave integrated circuit.

In accordance with a further aspect of the present invention, a direct digital synthesizer includes phase accumulator means fed by a command word and a clock signal for computing at each clock cycle a desired phase word proportional to the phase of a desired output frequency of the direct digital synthesizer. The direct digital synthesizer further includes a first RF switch fed by a local oscillator signal and a first digitally controlled phase shifter having an RF input and an RF output, said RF input being fed from said first switch. The direct digital synthesizer also includes a second digitally controlled phase shifter having an input fed by said first RF switch and an output. The direct digital synthesizer also includes a second RF switch having branch ports coupled to the output ports of said first and second phase shifters, and a common port coupled to the output of the digital synthesizer. Digital control means are provided to be responsive to the clock signal fed to the phase accumulator means and to be responsive to a phase output word provided from said phase accumulator means. The digital control means alternatively applies said phase output word to each of said pair of phase shifters and provides control signals to control terminals of said switches to respectively switch the applied local oscillator signal through one of said pair of phase shifters after said one of said pair of phase shifters has settled to a steady state phase state in response to the phase control word. With such an arrangement a direct digital synthesizer having relatively low levels of noise in the output signal is provided. In particular, digital controlled phase shifters generally do not settle from one phase shift state to another quickly or predictably. A given phase shift bit goes from a first state in which it has a certain low insertion loss to a phase of a different state which it has an equally low insertion loss through a trajectory in which both the insertion loss and the phase of the phase shifter are unpredictable. Such a trajectory introduces undesired noise in the output spectrum of the signal. The worst case scenario of the switching of a digital phase shifter occurs when the digital phase shifter has to "unwrap" all of its signal bits, that is, when the digital phase shifter must transition from a state where the bits of the binary control word are all logic ones to a state where the bits of the binary control word are all logic zeros. In particular, in this state a large amount of error power is provided to the signal during the transition. By providing a pair of channels each having a phase shifter and controlling the switches to switch between the phase shifters after one of the phase shifters has settled, a low amount of distortion in the output signal from the DDS is provided particularly since, unlike the phase shifters, the switches have relatively predictable transitions from one branch port to the other branch port.

BRIEF DESCRIPTION OF THE DRAWINGS

The foregoing features of this invention, as well as the invention itself, may be more fully understood from the following detailed description of the drawings, in which:

FIGS. 3A-3B are block diagrams of a fast phase accumulator useful for the circuit described in conjunction with FIG. 1.

DESCRIPTION OF THE PREFERRED EMBODIMENTS

Figure 1:
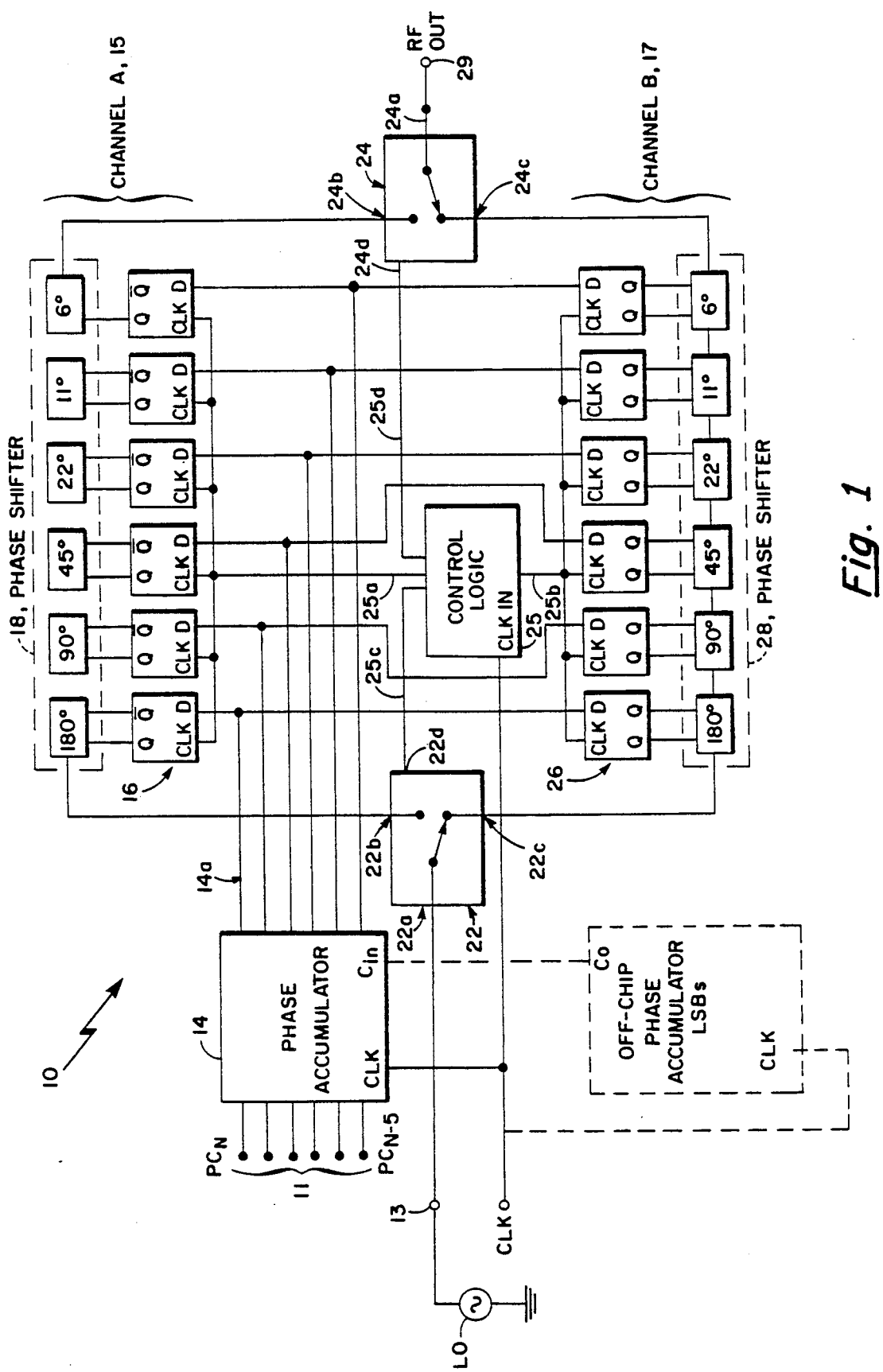
FIG. 1 is a block diagram showing a direct digital synthesizer using a serrodyne modulator in accordance with the present invention.
Figure 3A:
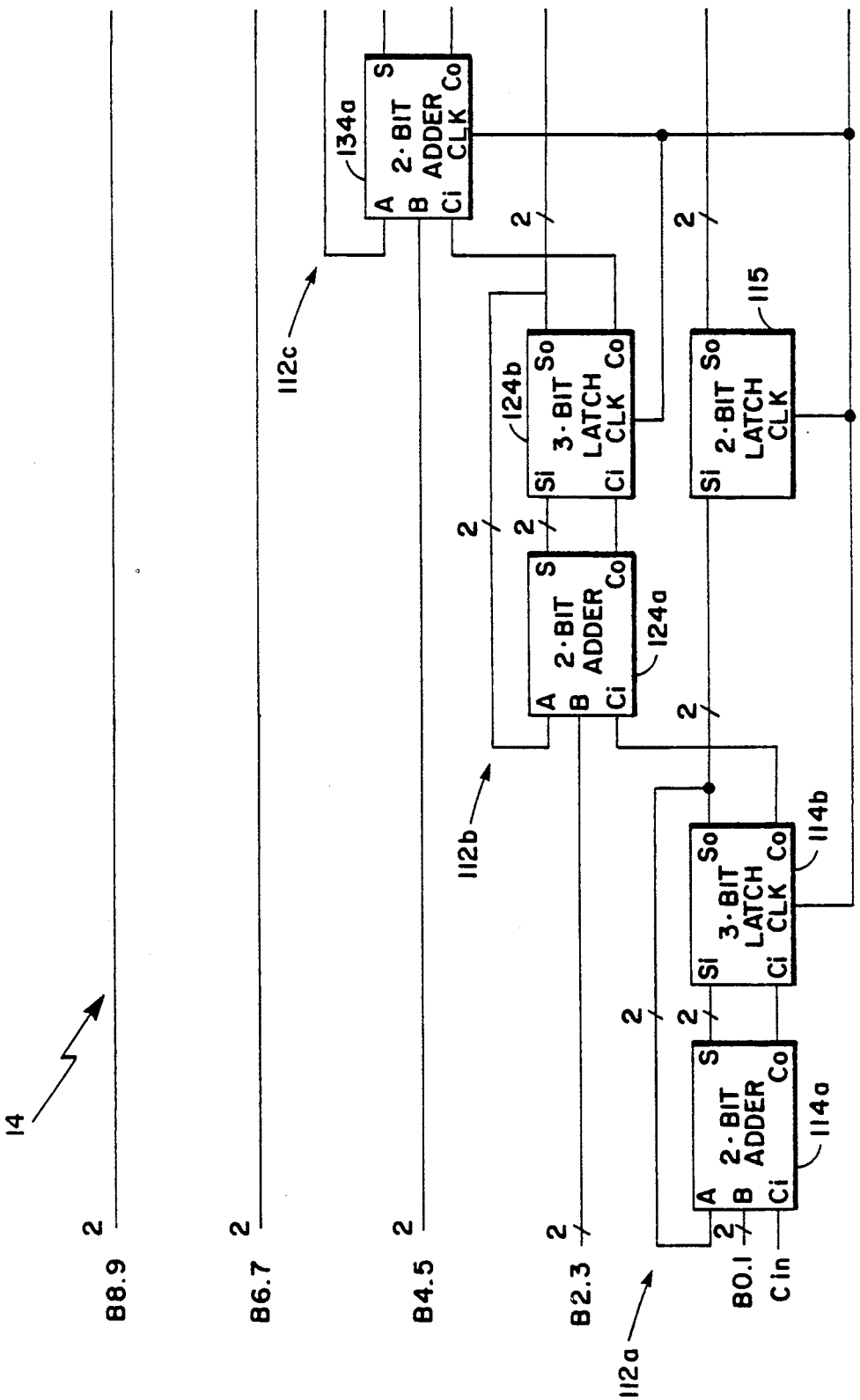
Figure 3:
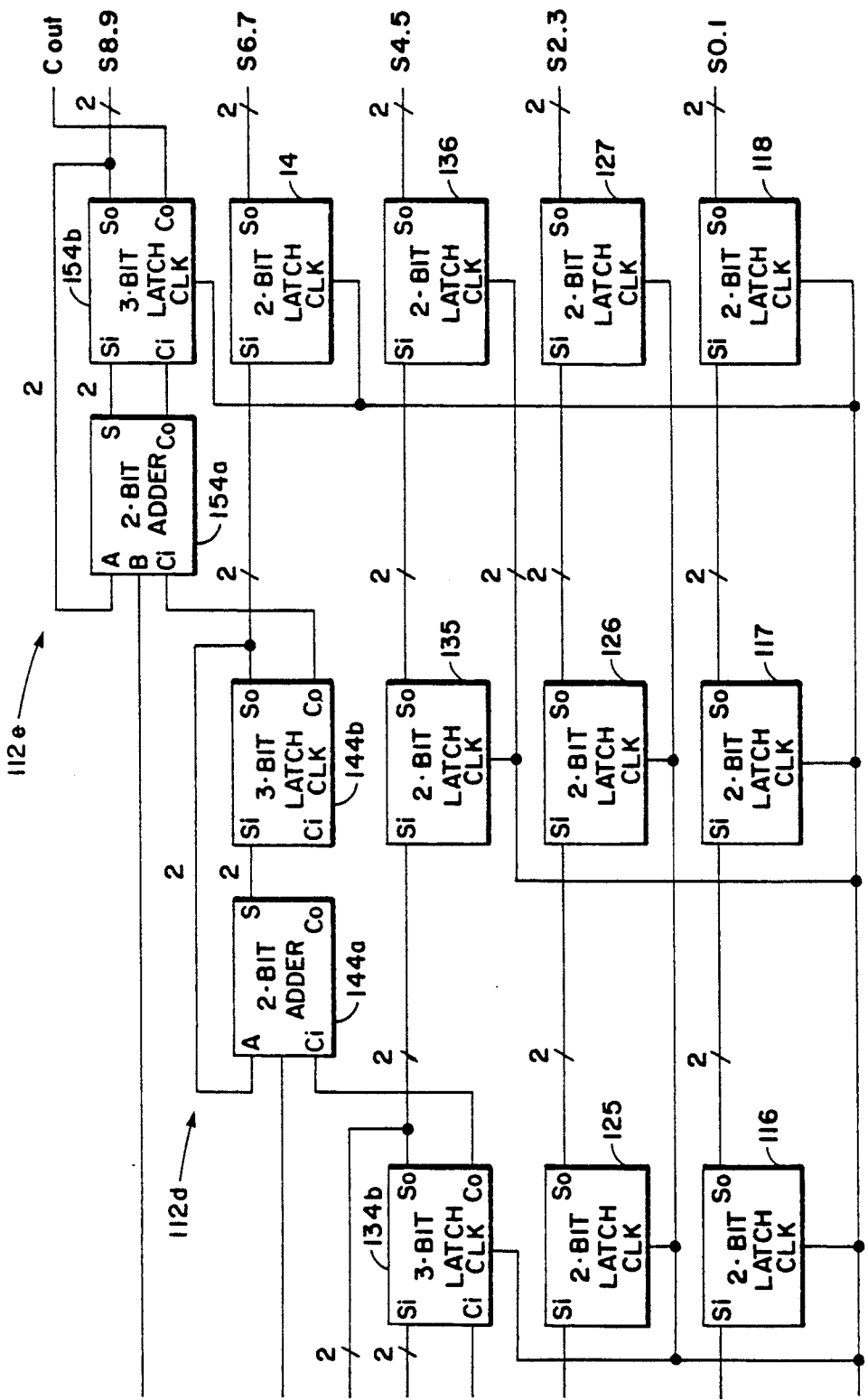
FIG. 3 is a diagram showing the relationship of FIG. 3A and FIG. 3B.

Referring now to FIG. 1, a direct digital synthesizer 10 is shown to include a plurality of input lines 11 here of N digital parallel bits $PC_{N-5}$ - $PC_N$ corresponding to a phase control word provided from a user device (not shown) of an N-bit length (here N=6) which is fed to an input of a phase accumulator 14 (as will be further described in conjunction with FIG. 3). The output phase word 14a of phase accumulator 14 is fed to one of a pair of registers 16, 26, here comprised of N (here N=6) D-type flip flops. The phase control word at the output 14a is loaded into one of said registers 16, 26 in response to control signals along lines 25a, 25b provided from control logic 25. Suffice it here to say that the control logic 25 provides signals to control loading of phase accumulator output signals to the pair of registers 16, 26. The phase accumulator control signals from said registers 16, 26 are fed to control terminals of a corresponding one of a pair of phase shifters 18 and 28. The phase accumulator control signals select the phase shift state of said phase shifters 18, 28.

The synthesizer 10 thus includes a first channel 15 including register 16 and phase shifter 18, and a second channel 17, including register 26 and phase shifter 28. One of the channels 15 and 17 are selected by controlling a pair of RF switches 22 and 24, with each one of said switches having common ports 22a, 24a and branch port pairs 22b, 22c; 24b, 24c, respectively as shown. Preferably, the RF switches have predictable characteristics during transition and more preferably the RF switches are of the make before break type, as is generally known. The common port 22a of switch 22 is coupled to here a local oscillator input terminal 13, which is fed a local oscillator signal having a frequency $f_{LO}$ from a stable local oscillator (LO) frequency source. A control signal from control logic 25 is fed along line 25c to control terminal 22d of switch 22 and in response to said control signal the common port 22a of switch 22 is coupled to a selected one of the pair of branch ports 22b or 22c which are coupled to inputs of phase shifters 18, 28, respectively. Similarly, the second RF switch 24 has its common port 24a coupled to an output 29 of the direct digital synthesizer and its branch ports 24b, 24c coupled to respective outputs of phase shifters 18 and 28, as shown. Switches 22, 24 are used to steer the LO signal at terminal 13, via transmission line (i.e. microstrip type, not shown), through one of said phase shifters 18, 28 and control port 24d fed by a signal on line 25d in accordance with the state of the control signals on lines 25c, 25d which are fed to control terminals 22d, 24d of switches 22, 24.

The phase accumulator 14 has a clock input "CLK," as well as, a carry-in input "$C_{in}$" which is here coupled to optionally additional phase accumulator circuits (shown in phantom) to provide additional resolution to the circuit other than that afforded by here $2^6$ number of states. As connected, the phase accumulator 14 provides the 6 most significant bits of the phase control word 11. For additional resolution, additional accumulator bits and phase shift increment bits are provided off-chip.

The frequency of the clock signal ($f_c$) fed to the phase accumulator clock input determines the frequency at which the phase information changes in the phase accumulator 14. Thus, for each clock cycle the phase is incremented by one phase increment ($\Delta\phi$) and the phase accumulator output phase word changes at a rate of $f_c(\Delta\phi)$. This phase information is fed to the inputs of registers 16 and 26 and is stored in one of said registers 16, 26 in response to the control signal on lines 25a, 25b fed from the control logic 25. Each phase word is alternately stored in one of said two registers 16 26 and is alternately applied to the corresponding one of said 6 bit phase shifters 18, 28 via lines 18a or 28a, as shown. If the phase accumulator output phase word is fed to one of the phase shifters, then the phase of the phase shifters will increase (modulo $2\pi$) over time (t) as $\phi(t) = t \cdot f_c \cdot (\Delta\phi)$.

In operation, while one of the phase shifters 18, 28 of said channels 15 and 17 is being set up with the proper digital control word from one of said registers 16, 26, the other one of said phase shifters 18, 28 in the other one of channels 15, 17 is maintained at the previous value of the digital control word applied to the respective one of the phase shifter 18 or 28. The local oscillator signal is fed through the respective phase shifter whose digital control word is being maintained. This channel thus provides an output for the direct digital synthesizer 10.

As an illustrative example, consider that, at the beginning of a certain clock cycle, the phase accumulator output phase word from phase accumulator 14 is stored via control logic signal 25a, in register 16. During the clock cycle, the outputs 14a of the phase accumulator change (by $\Delta\phi$ to a new value, but registers 16, 26 do not change the value. Register 26 has stored therein a previous value of the phase word from the phase accumulator 14. During this period of time, channel 17 is selected to provide the LO signal from the phase shifter 26 to terminal 29. The switches 22 and 24 are in the state as shown in FIG. 1 coupling common port 22a fed by the local oscillator signal through the channel 17 to the output 29 of the DDS 10. Prior to the next clock cycle (i.e. during the second half-cycle of the clock), the state of control signals 25c, 25d are changed to couple the LO through the upper channel 15. Hence, the output for the DDS is provided from phase shifter 16. During the clock cycle, the clock fed to the phase accumulator 14 causes the phase accumulator to change state. Thus, the output phase word is incremented and a new phase word is available at the inputs to register 26. At the beginning of the next clock cycle, a control signal on line 25b causes register 26 to change state to reflect the newly-available output control word on line 14a. However, the control logic 25 does not change the state of control signals 25c, 25d fed to the switches 22, 24 until the second half-cycle of the clock. This delay permits the phase shifter 26 to settle to a steady state condition whereupon the control logic provides signals on lines 25c, 25d to switch switches 22 and 24 to couple the local oscillator signal again through the lower channel 19. While the lower channel 17 is fed the local oscillator signal, the upper channel 15 is set up with the next phase word to permit on the next half clock cycle the channel 17 to modulate the local oscillator signal.

Figure 2:
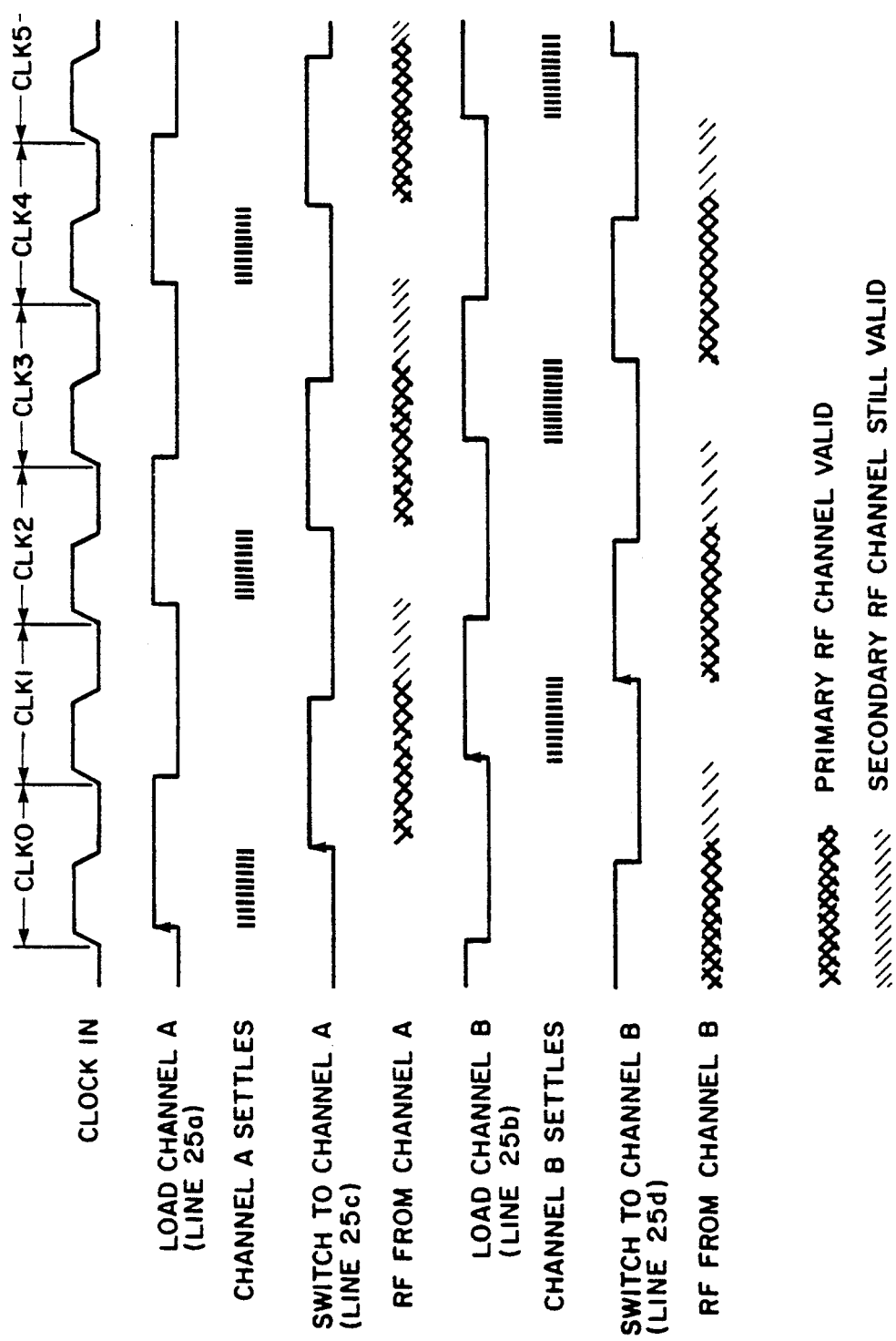
FIG. 2 is a timing diagram for control signals of FIG. 1.

Referring now to FIG. 2, a timing diagram which depicts a timing relationship between a clock input signal which is used to increment the phase accumulator 14 and register load signals which are fed along lines 25a, 25b and switch signals on lines 25c, 25d is shown. For each positive going leading edge of the clock signal the phase accumulator 14 is incremented in phase by an amount $\Delta\phi$ as will be further described in conjunction with FIG. 3. For each one of here the even clock cycles or periods, (CLK 0, CLK 2, CLK 4 . . . ) a load channel A, 15 signal is generated from the leading edge of the clock signal to load the output phase word into register 16. When the data are loaded into the register 16, the data are applied at the output of the register 16 to the control inputs of the phase shifter 18. In accordance with the state of each one of the bits of the data applied to the control inputs of the phase shifter 18, selected ones of the phase shift incremental bits, i.e. 180°, 90°, 45° . . . 5.6° and so forth are coupled into or out of the path of the local oscillator signal which is fed between the RF input and output ports of the phase shifter. After a time delay, here one clock half-cycle, to allow channel 15 to "settle," the control signals on lines 25c, 25d cause switches 22, 24 to couple the input 13 to the output 29 through the channel 15. Thus, the local oscillator signal LO is coupled through the phase shifter 18 and phase shifter 18 provides a phase-shifter LO signal as the output signal of the DDS 10 at terminal 29. On the odd clock cycles, CLK 1, CLK 3, CLK 5, and so forth, a signal is generated on line 26a to store data from the phase accumulator 14 into register 26. Such data in register 26 is applied to the phase shifter 28 and after a period of time sufficient to allow the phase shifter 28 to "settle," the control signal on lines 25c, 25d are switched to couple the local oscillator fed to common port 22a through the channel 17 and thus through the phase shifter 28 and to the output 29 of the DDS 10. By providing this "ping-ponged" approach, the frequency of the DDS can be rapidly changed by clocking the phase accumulator 14 whereas the noise power attributed to phase shifter transitions in the output signal from the DDS 10 can be minimized by selecting one of the two channels to provide the output of the DDS after the selected channel has had a sufficient period of time to settle into a steady state condition.

Referring now to FIG. 3, an embodiment of a phase accumulator 14, suitable for use in the DDS 10 described in conjunction with FIGS. 1 and 2, is shown to include here 5 stages of adder/latch pairs 112a-112e each including a 2 bit adder and 3 bit latch. Using adder/latch pair 112a as an illustrative example, the adder/latch pair 112a includes a 2 bit adder 114 fed by a pair of input signals B0 and B1 which are fed to a first pair of inputs B of the adder and a carry input $C_i$ which is fed from a previous (not shown) stage of the phase accumulator 14. The outputs S of the adder 114a are fed to the inputs $S_i$ of a 3 bit latch 114b, with the outputs $S_o$ of the 3 bit latch being fed back to a second pair of inputs of the 2 bit adder 114a and also being fed on to succeeding latches here 115-118, as shown. The carry out output $C_o$ of the adder is also fed to a third input of the 3 bit latch 114b, here labelled $C_i$. The output bit corresponding to $C_i$ (i.e. the carry output) is fed to the carry input of a subsequent 2 bit adder of the subsequent pair 112b as shown. Each one of these nested pairs are arranged as shown, and as generally described for pair 112a. That is, each one of the pairs is fed one of the pairs of input signals B0-B9 and a carry input from a preceding one of said pairs 112a-112e of adders and latches. The outputs of said latches are fed to here subsequent stages of the phase accumulator. For the first pair of adders/latches, the outputs are fed through four, 2 bit latches to synchronize the output bits with the four subsequent stages 112b-112e through which the carry bit must propagate through the phase accumulator 14. The output bits of the second pair 112b are fed through 3 stages of latches 125-127 whereas the output bits of the third pair 112c are fed through two latches 135, 136. Likewise, the output bits of the fourth pair 112d are fed to one latch 145 and the output bits of here the fifth and last pair 112e are fed directly to the output of the phase accumulator 14. The system clock is used to clock each one of the latches and thus to synchronize each of the pair of preceding bits from the phase accumulator to provide at the output of the phase accumulator at each clock cycle (after the pipeline structure has been filed) a new incremented phase control word. Here the six most significant bits of said phase control word, that is, bits S4-S9 are applied to the registers 16, 26 and thus to the phase shifters 26 and 28 (shown in FIG. 1).

In operation, a command word 11 having bits B0-B9 is fed to the command word inputs of the phase accumulator 14. The input command word $\Delta\phi$ is a binary number proportional to the desired output frequency from DDS 10. In operation, each latch 114b-154b and 115-118; 125-127; 135-136 and 145 are clocked repetitively at frequency $f_c$ by a system clock. This causes the output of latch to follow the input of said latch at a particular instant of the clock. For each clock cycle ($f_c$), $\phi$ increases by an amount $\Delta\phi$, thus the output of the latch is a binary number which increases at a rate of $f_c\cdot\Delta\phi$.

Figure 4A:
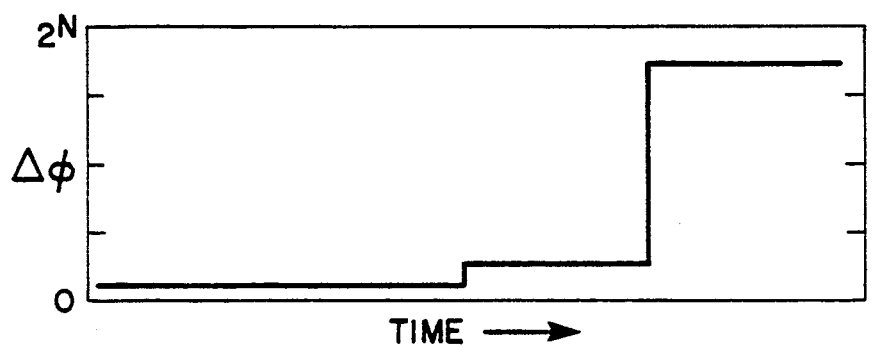
FIG. 4A-4C are plots useful in understanding the operation of the direct digital synthesizer showing a relationship between phase increments (FIGS. 4A, 4B) and LO signal (FIG. 4C) and time.
Figure 4B:
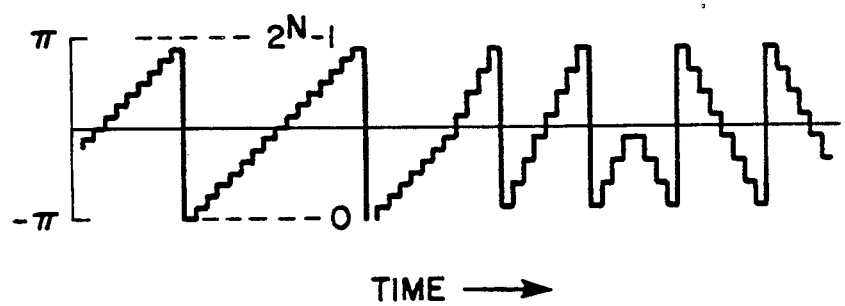
Figure 4C:
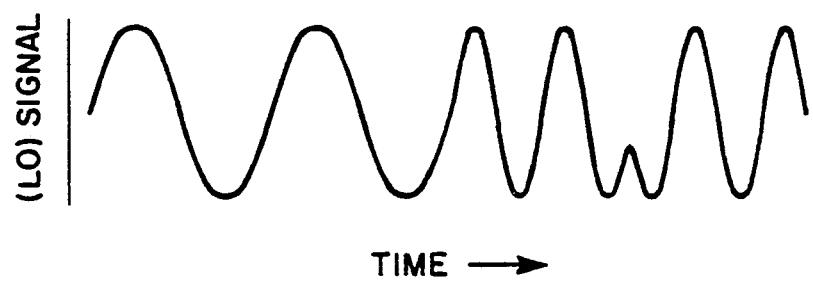

Referring now to FIG. 4A-4C, representations of phase from phase accumulator 14 over time are shown. The command word fed to lines B0-B9 (FIG. 3) is shown as taking on a certain value for a period of time and then changing to twice such value at a subsequent period of time (FIG. 4A). The resulting output of the phase accumulator 14 is a digital ramp (FIG. 4B) whose slope changes when the command word changes, (i.e. the output resembles a variable frequency digital controlled digital sawtooth). This waveform is alternately applied to the phase shifters 18, 28 to serrodyne the phase of the local oscillator signal fed through one of the phase shifters 18, 28 and thus to modulate the local oscillator signal (FIG. 4c).

Given $\phi(t)$, the microwave frequency local oscillator signal whose frequency is $f_{LO}$ is modulated by $\phi(t)$ to obtain the desired RF output signal at a desired frequency at the output of the DDS 10. This technique is a serrodyne modulator in which the phase of the local oscillator signal is directly modulated by a phase shifter to produce a phase shift $\phi(t)$. The resulting output frequency is then $$\omega = (d/dt)(\phi_{total}) = (d/dt)(\omega_o t + \phi(t)) = \omega_o + f_c\Delta\phi.$$

The ping-pong approach for the direct digital synthesizer 10 provides reduced noise power at the output of the synthesizer 10. In general, the phase information in the DDS is most directly related as a binary word in which each bit has a fixed weight and corresponds to the presence or absence of the corresponding phase shift. With the usual MMIC phase shifter (i.e. a monolithic microwave integrated circuit phase shifter employing Group III-V technology such as gallium arsenide), a multi-bit digital phase shifter implements this function directly. In usual implementations of digital phase shifters however, the transitions from one phase setting to another phase setting are not graceful. That is, a given phase bit goes through a state of undefined phase shift and insertion loss as it makes the transition from its initial state, in which it has certain low insertion loss and defined phase, to its final state, which it has an equally low insertion loss at a different phase. During the transition, both the insertion loss and the phase are far from the initial and final desired values.

Figure 5A:
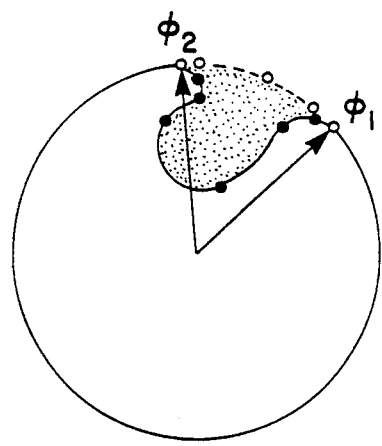
FIGS. 5A-5C are diagrammatical representations of the transitions of a digital controlled phase shifter showing the trajectories during phase transitions and the error power associated with such transitions.
Figure 5B:
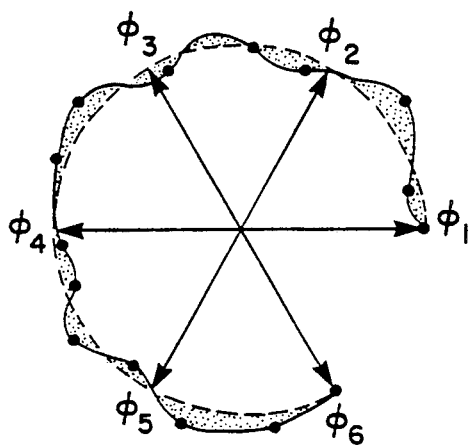
Figure 5C:
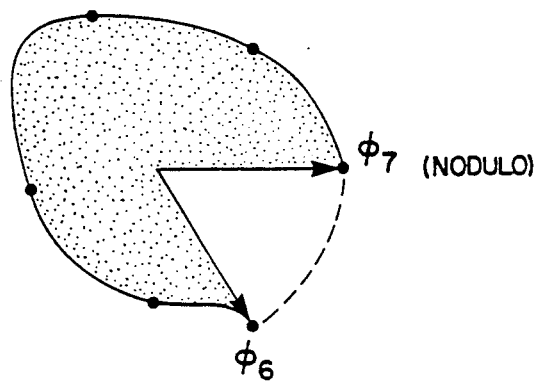

Such a trajectory of the RF output is shown figuratively in FIGS. 5A-5C. The undesired trajectory is generally represented by the solid line and the spurious power provide by such trajectory is represented by shaded area whereas the desired trajectory is represented by the dotted line as shown. Using FIG. 5A as an example, when the command phase changes from $\phi 1$ to $\phi 2$ the initial and final states are shown by the two phases. The ideal state trajectory will be a smooth transition at constant insertion loss as shown by the open circles and the dashed line. A typical real trajectory, however, is shown by the solid line and filled circles.

In a modulator which transitions through multiple states, as shown in FIG. 5B, the shaded area between two adjacent trajectories represents noise or error power and would contribute to frequency generation at spurious or undesired frequencies. These spurious frequencies are provided in the output signal from the DDS. Such behavior is common in the circuitry of a typical MMIC digitally controlled phase shifter. The field effect transistors (MESFETs) employed in such circuits are generally used at a low resistance in the "on" state and a low loss capacitance in the "off" state. For bias voltages between the values produced by these impedance values the FET is a high resistance which usually provides a significant insertion loss during the transition.

When such a phase shifter is used in most applications such as in a phased array, its RF properties during a phase change are essentially irrelevant. However, if the phase shifter is used in a phase modulator in a DDS, these properties become critical since the undefined state of the phase shifter in each of the aforementioned trajectories introduces error power into the output of the DDS and thus makes the DDS extremely noisy having low levels of spectral purity.

The most serious trajectory problem occurs with the phase shifter with the transition of all the phase shifter bits being turned "on" to all the phase shifter bits being turned "off." The phase shifter must unwrap all of the bits to go back to the zero or initial state. The shaded area corresponding to this transition is shown, in particular, in FIG. 5C.

By providing the pair of channels and alternately switching between the pair of channels, the glitches or unpredictable transitions between different phase shift states are not fed to the output of the DDS since the phase shifter is allowed to settle prior to switching channels to feed the newly updated phase shifter to the output of the DDS 10.

In the preferred embodiment, the DDS 10 is fabricated as a monolithic microwave integrated circuit. Preferably still the digital portions of the circuit are integrated directly with the analog portions of the circuit. That is, the digitally controlled phase shifter, which is in essence a monolithic microwave integrated circuit is integrated directly with its corresponding the digital registers on a common gallium arsenide substrate. The associated switches 23, 24 and the pipeline phase accumulator 14 (FIG. 1) are also preferably formed on a common substrate. This would eliminate the attendant packaging and bonding operations associated with interconnecting the many digital lines to the analog monolithic microwave integrated circuits such as the phase shifter 16 and 26. A preferred technique for implementing analog microwave integrated circuits and digital integrated circuits on a common gallium arsenide or other Group III-V semiconductor substrate is described in copending application Ser. No. 553,940, filed July 16, 1990 by Irl Smith, entitled "Digital Monolithic Microwave Integrated Circuits." Said case is assigned to the assignee of the present invention and is incorporated herein by reference.

Alternate arrangements are also possible. For example, in applications where high spectral purity is not required, only a single phase shifter without the ping-pong channel arrangement may be used. Further, the input switch 22 may be replaced by a power divider which would feed the local oscillator signal to each phase shifter 18, 28. Only the output from the phase shifter whose phase transitions had settled would be selected by the output switch 24 to provide the output from the direct digital synthesizer. Other switching and steering arrangements are of course possible.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A direct digital synthesizer comprising:
   phase accumulator means fed by a control word for computing a desired phase word whose time rate of change is proportional to a desired output frequency of the direct digital synthesizer; and
   a radio frequency phase shifter having an RF input port, and RF output port, and a control port which controls the relative phase difference between an input signal fed to the input and output signal provides from the output with said phase word being fed to said control port and said relative difference being related to the phase word provided from said phase accumulator means.

2. A direct digital synthesizer comprising:
   phase accumulator means fed by a control word for computing a desired phase word whose time rate of change is proportional to a desired output frequency of the direct digital synthesizer;
   means, fed by a local oscillator signal for providing a pair of portions of said signal;
   first and second phase shifters having inputs fed by said pair of portions of said signal, with each phase shifter having an output;
   an r.f. switch having a pair of branch ports coupled to respective output ports of said first and second phase shifters and a common port coupled to the output terminal of the direct digital synthesizer; and
   means for controlling said RF switch and for applying the desired word to selected ones of said first and second phase shifters.

3. The synthesizer, as recited in claim 2, wherein said controlling means further comprises a pair of registers having inputs fed by the phase control word and outputs coupled to control ports of said first and second phase shifters.

4. The synthesizer, as recited in claim 3, wherein said phase shifters are digitally controlled phase shifters and said outputs from the registers are fed directly to control ports of said digitally controlled phase shifter.

5. The synthesizer as recited in claim 2 wherein said providing means is a second r.f. switch having a common port fed by said local oscillator signal and a pair of branch ports coupled to said inputs of said first and second phase shifters, and a control terminal fed by a signal to control coupling of the common port to the pair of branch ports of the switch.

6. The synthesizer as recited in claim 2 wherein said providing means is an r.f. power divider.

* * * * *